United States Patent
Park

(10) Patent No.: US 10,854,842 B2
(45) Date of Patent: Dec. 1, 2020

(54) DISPLAY DEVICE

(71) Applicant: LG Display Co., Ltd., Seoul (KR)

(72) Inventor: Geondo Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 57 days.

(21) Appl. No.: 16/151,564

(22) Filed: Oct. 4, 2018

(65) Prior Publication Data

US 2019/0115563 A1    Apr. 18, 2019

(30) Foreign Application Priority Data

Oct. 16, 2017  (KR) .......................... 10-2017-0134180

(51) Int. Cl.
| | |
|---|---|
| H01L 51/52 | (2006.01) |
| H01L 27/32 | (2006.01) |
| G09G 3/3233 | (2016.01) |
| H01L 51/56 | (2006.01) |

(52) U.S. Cl.
CPC ....... *H01L 51/5253* (2013.01); *G09G 3/3233* (2013.01); *H01L 27/3246* (2013.01); *H01L 27/3276* (2013.01); *H01L 51/5228* (2013.01); *H01L 51/56* (2013.01); *G09G 2310/0264* (2013.01)

(58) Field of Classification Search
CPC ..... G02F 2001/134318; G02F 1/13452; H01L 27/3279; H01L 51/5253; H01L 27/3276; H01L 51/5228; H01L 27/3246; H01L 51/56; G09G 3/3233; G09G 2310/0264
See application file for complete search history.

(56) References Cited

U.S. PATENT DOCUMENTS

| | | | |
|---|---|---|---|
| 7,528,544 B2 | 5/2009 | Kwak et al. | |
| 2015/0090983 A1* | 4/2015 | Ozawa | H01L 27/3279 |
| | | | 257/40 |
| 2018/0090554 A1* | 3/2018 | Choi | H01L 27/3258 |
| 2019/0041915 A1* | 2/2019 | Park | H01L 27/3262 |

FOREIGN PATENT DOCUMENTS

| | | |
|---|---|---|
| JP | 2005-049808 A | 2/2005 |
| JP | 2010-191368 A | 9/2010 |
| KR | 10-2007-0117363 A | 12/2007 |
| KR | 10-2014-0080231 A | 6/2014 |

OTHER PUBLICATIONS

Office Action (with partial translation) issued in corresponding Japanese Patent Application No. 2018-189451, dated Sep. 10, 2019.
Office Action issued in corresponding Japanese Patent Application No. 2018-189451, dated Sep. 10, 2019.

* cited by examiner

*Primary Examiner* — Latanya N Crawford Eason
(74) *Attorney, Agent, or Firm* — Morgan, Lewis & Bockius LLP

(57) ABSTRACT

A display device for preventing a damage of an electrode contact portion is disclosed. The display device includes a display area, on which an organic light emitting diode including a first electrode, an organic layer, and a second electrode is positioned, and a non-display area positioned outside the display area. The non-display area includes an electrode contact portion in which the second electrode and a low potential voltage line are connected to each other through at least one connection pattern. The electrode contact portion includes a passivation layer including a plurality of passivation holes exposing the at least one connection pattern, and an overcoat layer including an overcoat hole exposing the passivation layer.

8 Claims, 12 Drawing Sheets

※ Resistance(R) = $\rho * L / T * W$
$\rho$ : Electrical resistivity of material

DISPLAY DEVICE This application claims the priority benefit of Korean Patent Application No. 10-2017-0134180 filed on Oct. 16, 2017 which are incorporated herein by reference for all purposes as if fully set forth herein.

BACKGROUND

Technical Field

The present disclosure relates to a display device, and more particularly to a display device for preventing a damage of an electrode contact portion resulting from a resistance.

Discussion of the Related Art

With the development of information society, the demands for display devices displaying an image are increasing in various ways. In a field of the display devices, a large-sized cathode ray tube (CRT) has been rapidly replaced by a flat panel display (FPD) having advantages of a thin profile, light weight, and a large-sized screen. Examples of the flat panel display include a liquid crystal display (LCD), a plasma display panel (PDP), an organic light emitting diode (OLED) display, and an electrophoresis display (EPD).

An OLED display includes self-emitting elements capable of emitting light by themselves and has advantages of a fast response time, a high emission efficiency, a high luminance, and a wide viewing angle. In particular, the OLED display can be manufactured on a flexible plastic substrate. In addition, the OLED display has advantages of a lower driving voltage, lower power consumption, and better color tone as compared to a plasma display panel or an inorganic electroluminescent display.

The OLED display includes a first electrode as an anode, an organic layer as a light emitting element, and a second electrode as a cathode. A high potential voltage is applied to the first electrode, and a low potential voltage is applied to the second electrode. A driving current flows between the first electrode and the second electrode, and the organic layer emits light with the driving current. A plurality of signal lines of the same type or different types or a plurality of electrodes of the same type or different types are in contact with one another and are connected to thereby drive the OLED display. However, when the signal lines or the electrodes of different types are in contact with one another, a temperature increases depending on a resistance of a contact portion. When the temperature increases to be equal to or greater than a critical value, the contact portion is damaged.

SUMMARY

Accordingly, embodiments of the present disclosure are directed to a display device that substantially obviates one or more of the problems due to limitations and disadvantages of the related art.

The present disclosure provides a display device capable of preventing a damage of an electrode contact portion resulting from a resistance.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises a display area on which an organic light emitting diode including a first electrode, an organic layer, and a second electrode is positioned, and a non-display area positioned outside the display area, the non-display area including an electrode contact portion in which the second electrode and a low potential voltage line are connected to each other through at least one connection pattern, wherein the electrode contact portion includes a passivation layer including a plurality of passivation holes exposing the at least one connection pattern, and an overcoat layer including an overcoat hole exposing the passivation layer.

An entire perimeter of the plurality of passivation holes may be longer than a perimeter of the overcoat hole.

An area of inclined portions of the plurality of passivation holes may be greater than an area of an inclined portion of the overcoat hole.

The plurality of passivation holes may be disposed inside the overcoat hole.

The display device may further comprise a first connection pattern positioned on the low potential voltage line and contacting the low potential voltage line and a second connection pattern positioned on the first connection pattern and contacting the first connection pattern.

The second connection pattern may contact the first connection pattern along inclined portions of the plurality of passivation holes.

The passivation layer may be positioned between the first connection pattern and the second connection pattern. The plurality of passivation holes may expose the first connection pattern.

The second electrode may be positioned on the second connection pattern and may contact the second connection pattern.

The first electrode may be an anode, and the second electrode may be a cathode.

The plurality of passivation holes may have a stripe planar shape or a dot planar shape.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

DETAILED DESCRIPTION

Reference will now be made in detail to embodiments of the disclosure, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the disclosure. Names of the respective elements used in the following explanations are selected only for convenience of writing the specification and may be thus different from those used in actual products. In the description of positional relationships, when a structure is described as being positioned "on or above", "under or below", "next to" another structure, this description should be construed as including a case in which the structures directly contact each other as well as a case in which a third structure is disposed therebetween.

A display device according to embodiments of the disclosure is a display device in which a display element is formed on a glass substrate or a flexible substrate. Examples of the display device include an organic light emitting diode (OLED) display, a liquid crystal display (LCD), and an electrophoresis display. Embodiments of the disclosure are described using the OLED display by way of example. An OLED display includes an organic layer which is formed between a first electrode serving as an anode and a second electrode serving as a cathode using an organic material. The OLED display is a self-emission display configured to form hole-electron pairs, i.e., excitons, by combining holes received from the first electrode and electrons received from the second electrode inside the organic layer and emit light by energy generated when the excitons return to a ground level.

Embodiments of the disclosure are described with reference to FIGS. 1 to 17.

Figure 1:
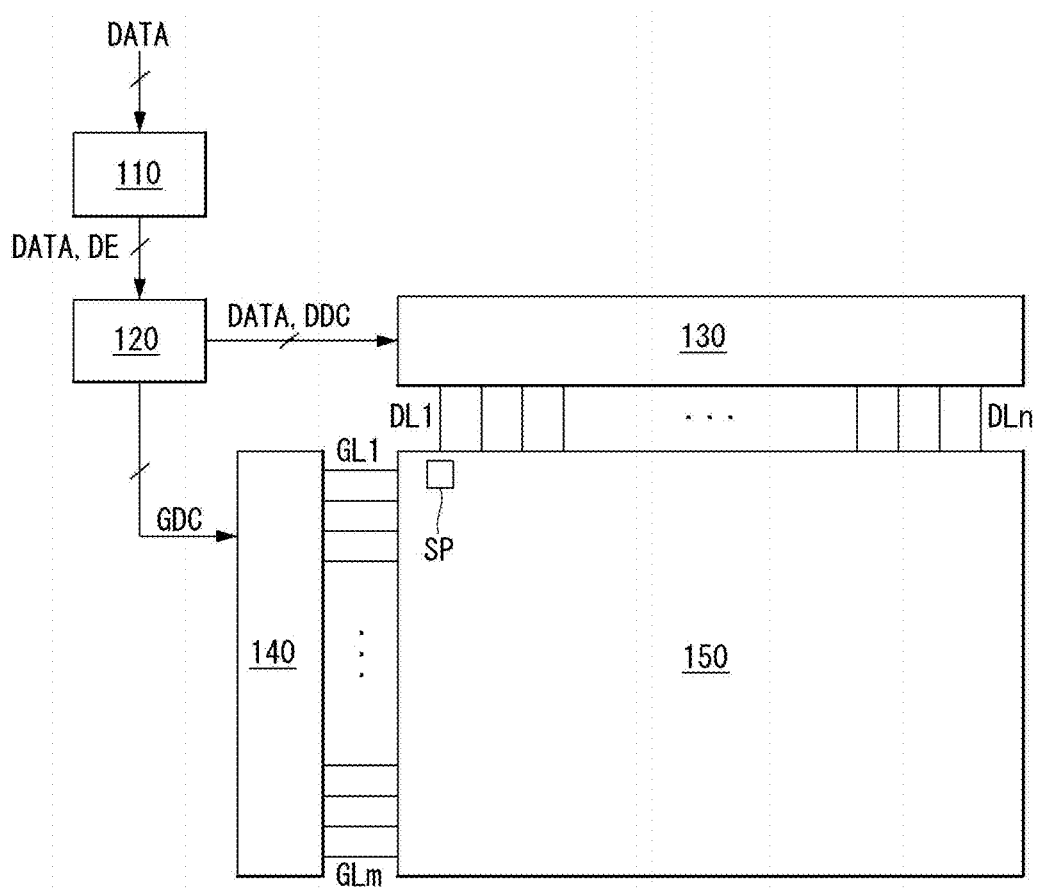
FIG. 1 is a schematic block diagram of an organic light emitting diode (OLED) display according to an embodiment of the disclosure.
Figure 2:
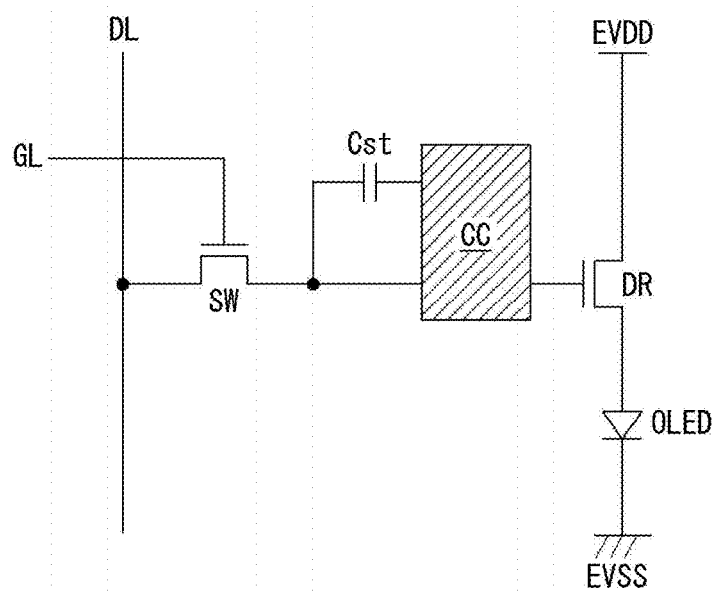
FIG. 2 schematically illustrates a circuit configuration of a subpixel.
Figure 3:
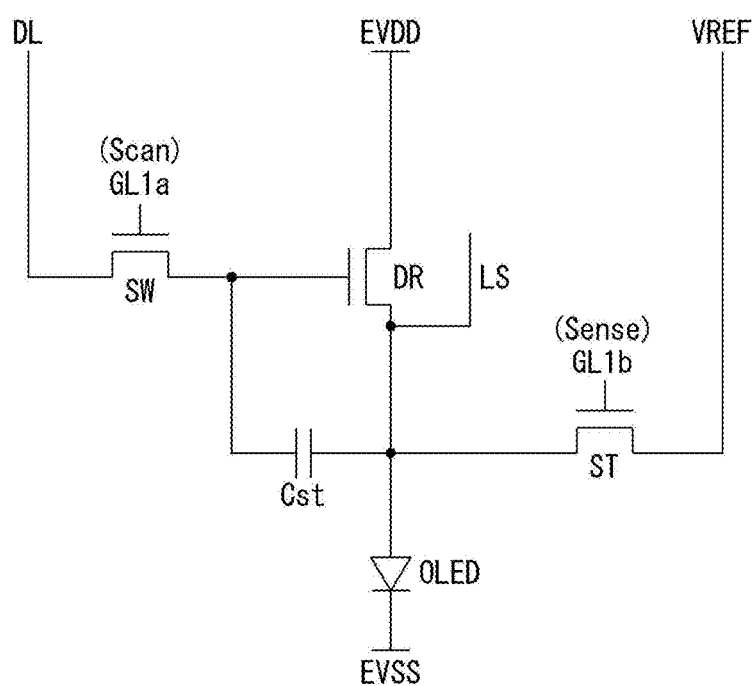
FIG. 3 illustrates in detail a circuit configuration of a subpixel.
Figure 4:
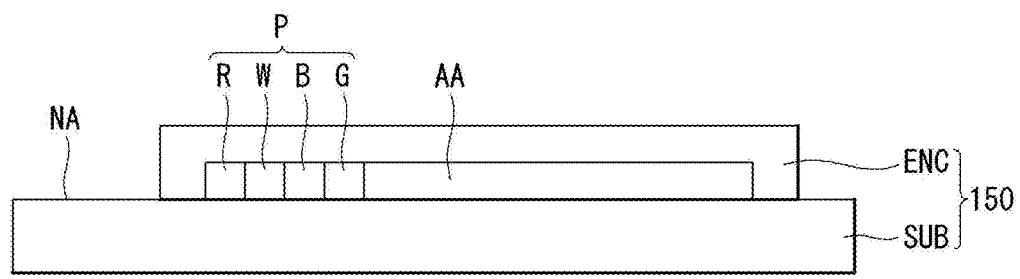
FIG. 4 illustrates an example of a cross-sectional view of a display panel.

FIG. 1 is a schematic block diagram of an OLED display according to an embodiment of the disclosure. FIG. 2 schematically illustrates a circuit configuration of a subpixel. FIG. 3 illustrates in detail a circuit configuration of a subpixel. FIG. 4 illustrates an example of a cross-sectional view of a display panel.

As shown in FIG. 1, an OLED display according to an embodiment of the disclosure may include an image processing unit 110, a timing controller 120, a data driver 130, a scan driver 140, and a display panel 150.

The image processing unit 110 outputs a data signal DATA, a data enable signal DE, etc. supplied from the outside. The image processing unit 110 may output one or more of a vertical sync signal, a horizontal sync signal, and a clock signal in addition to the data enable signal DE. These signals are not shown for convenience of explanation.

The timing controller 120 receives the data signal DATA and driving signals including the data enable signal DE, the vertical sync signal, the horizontal sync signal, the clock signal, etc. from the image processing unit 110. The timing controller 120 outputs a gate timing control signal GDC for controlling operation timing of the scan driver 140 and a data timing control signal DDC for controlling operation timing of the data driver 130 based on the driving signals.

The data driver 130 samples and latches the data signal DATA received from the timing controller 120 in response to the data timing control signal DDC received from the timing controller 120 and converts the latched data signal DATA into a gamma reference voltage to output the gamma reference voltage. The data driver 130 outputs the data signal DATA to data lines DL1 to DLn. The data driver 130 may be formed as an integrated circuit (IC).

The scan driver 140 outputs a scan signal in response to the gate timing control signal GDC supplied from the timing controller 120. The scan driver 140 outputs the scan signal to gate lines GL1 to GLm. The scan driver 140 may be formed as an IC or formed on the display panel 150 in a gate-in-panel (GIP) manner.

The display panel 150 displays an image in response to the data signal DATA and the scan signal respectively received from the data driver 130 and the scan driver 140. The display panel 150 includes subpixels SP configured to display an image.

The subpixels SP may include red subpixels, green subpixels, and blue subpixels, or may include white subpixels, red subpixels, green subpixels, and blue subpixels. Further, one or more of the subpixels SP may have different emission areas depending on emission characteristics.

As shown in FIG. 2, each subpixel may include a switching transistor SW, a driving transistor DR, a capacitor Cst, a compensation circuit CC, and an organic light emitting diode OLED.

The switching transistor SW performs a switching operation so that a data signal supplied through a data line DL1 is stored in the capacitor Cst as a data voltage in response to a scan signal supplied through a gate line GL1. The driving transistor DR enables a driving current to flow between a first power line (or referred to as "high potential power line") EVDD and a second power line (or referred to as "low potential power line") EVSS depending on the data voltage stored in the capacitor Cst. The organic light emitting diode OLED emits light with the driving current provided by the driving transistor DR.

The compensation circuit CC is added to the subpixel and compensates for a characteristic including a threshold voltage, etc. of the driving transistor DR. The compensation circuit CC includes one or more transistors. Configuration of the compensation circuit CC may be variously changed in accordance with various embodiments, depending on an external compensation method and is described below with reference to FIG. 3.

As shown in FIG. 3, the compensation circuit CC may include a sensing transistor ST and a sensing line (or referred to as "reference line") VREF. The sensing transistor ST is connected between the sensing line VREF and a node (hereinafter referred to as "sensing node") that is electrically coupled to a second electrode, e.g., a drain electrode of the driving transistor DR and to an anode electrode of the organic light emitting diode OLED. The sensing transistor ST may supply a sensing voltage (or referred to as "initialization voltage") transmitted through the sensing line VREF to the sensing node of the driving transistor DR, or may sense a voltage or a current of the sensing node of the driving transistor DR or a voltage or a current of the sensing line VREF.

A first electrode of the switching transistor SW is connected to the data line DL1, and a second electrode of the switching transistor SW is connected to a gate electrode of the driving transistor DR. A first electrode of the driving transistor DR is connected to the first power line EVDD, and a second electrode of the driving transistor DR is connected to the anode electrode of the organic light emitting diode OLED. A first electrode of the capacitor Cst is connected to the gate electrode of the driving transistor DR, and a second electrode of the capacitor Cst is connected to the anode electrode of the organic light emitting diode OLED. The anode electrode of the organic light emitting diode OLED is connected to the second electrode of the driving transistor DR, and a cathode electrode of the organic light emitting diode OLED is connected to the second power line EVSS. A first electrode of the sensing transistor ST is connected to the sensing line VREF, and a second electrode of the sensing transistor ST is connected to the sensing node, i.e., the anode electrode of the organic light emitting diode OLED and the second electrode of the driving transistor DR.

An operation time of the sensing transistor ST may be similar to (or the same as) or different from an operation time of the switching transistor SW depending on an external compensation algorithm (or depending on a configuration of the compensation circuit). For example, a gate electrode of the switching transistor SW may be connected to a 1a gate line GL1a, and a gate electrode of the sensing transistor ST may be connected to a 1b gate line GL1b. In this instance, a scan signal (Scan) may be transmitted to the 1a gate line GL1a, and a sensing signal (Sense) may be transmitted to the 1b gate line GL1b. As another example, the gate electrode of the switching transistor SW and the gate electrode of the sensing transistor ST may share the 1a gate line GL1a or the 1b gate line GL1b, and thus the gate electrodes of the switching transistor SW and the sensing transistor ST may be connected.

The sensing line VREF may be connected to the data driver, e.g., the data driver 130 shown in FIG. 1. In this instance, the data driver may sense the sensing node of the subpixel during a non-display period of a real-time image or N frame period and may generate a result of the sensing, where N is an integer equal to or greater than 1. The switching transistor SW and the sensing transistor ST may be turned on at the same time. In such a case, a sensing operation using the sensing line VREF and a data output operation outputting the data signal are separated (or distinguished) from each other in accordance with a time-division driving method of the data driver.

In addition, a compensation target according to the sensing result may be a digital data signal, an analog data signal, a gamma signal, or the like. The compensation circuit for generating a compensation signal (or a compensation voltage) based on the sensing result may be implemented inside the data driver, inside the timing controller, or as a separate circuit.

A light shielding layer LS may be disposed only below a channel region of the driving transistor DR. Alternatively, the light shielding layer LS may be disposed below the channel region of the driving transistor DR and below channel regions of the switching transistor SW and the sensing transistor ST. The light shielding layer LS may be simply used for shielding external light. In addition, the light shielding layer LS may be connected to another electrode or another line and used as an electrode constituting the capacitor, etc. Therefore, the light shielding layer LS may be provided as a multilayer element formed of metal (for example, a multilayer of different metals), so as to have light shielding characteristics.

FIG. 3 illustrates the subpixel having a 3T(Transistor)1C (Capacitor) configuration, including the switching transistor SW, the driving transistor DR, the capacitor Cst, the organic light emitting diode OLED, and the sensing transistor ST, by way of example. However, when the compensation circuit CC is added to the subpixel, the subpixel may have various configurations such as 3T2C, 4T2C, 5T1C, and 6T2C.

As shown in FIG. 4, subpixels are formed on a display area AA of a substrate (or referred to as "thin film transistor substrate") SUB, and each subpixel may have the circuit structure illustrated in FIG. 3. The subpixels on the display area AA are sealed by a protective member ENC. In FIG. 4, a reference numeral "NA" denotes a non-display area of the display panel 150.

The subpixels are arranged on a surface of the substrate SUB, and may be horizontally or vertically arranged in order of red (R), white (W), blue (B), and green (G) subpixels on the display area AA, depending on an orientation of the substrate SUB. The red (R), white (W), blue (B), and green (G) subpixels together form one pixel P. However, embodiments are not limited thereto. For example, the arrangement order of the subpixels may be variously changed depending on an emission material, an emission area, configuration (or structure) of the compensation circuit, and the like. Further, the red (R), blue (B), and green (G) subpixels may form one pixel P.

Figure 5:
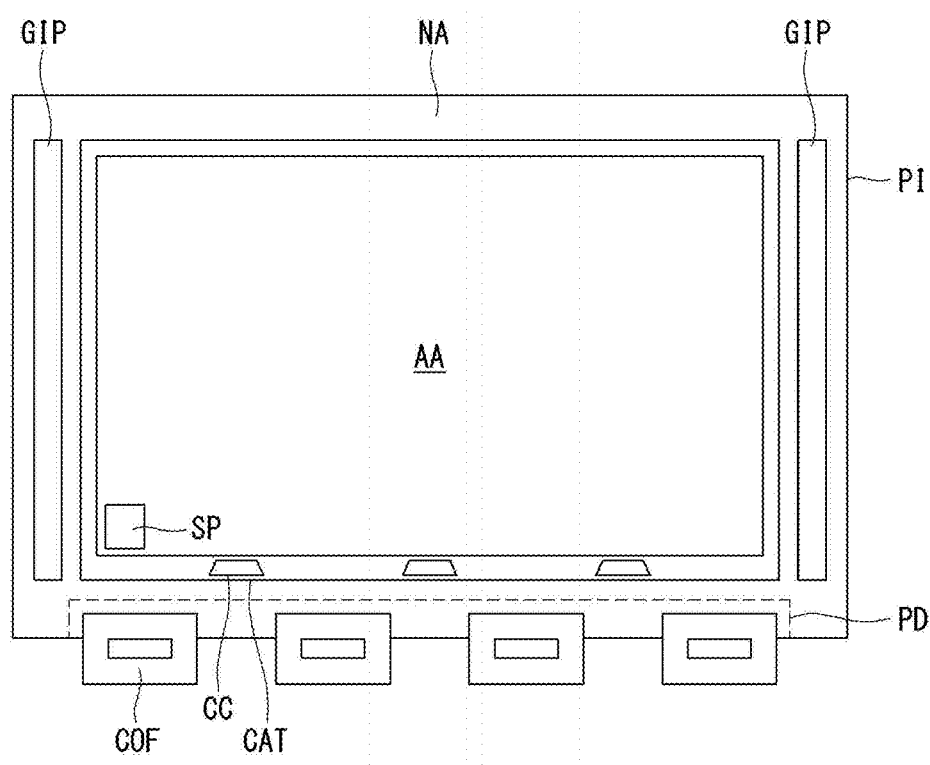
FIG. 5 is a plan view of an OLED display according to an embodiment of the disclosure.
Figure 6:
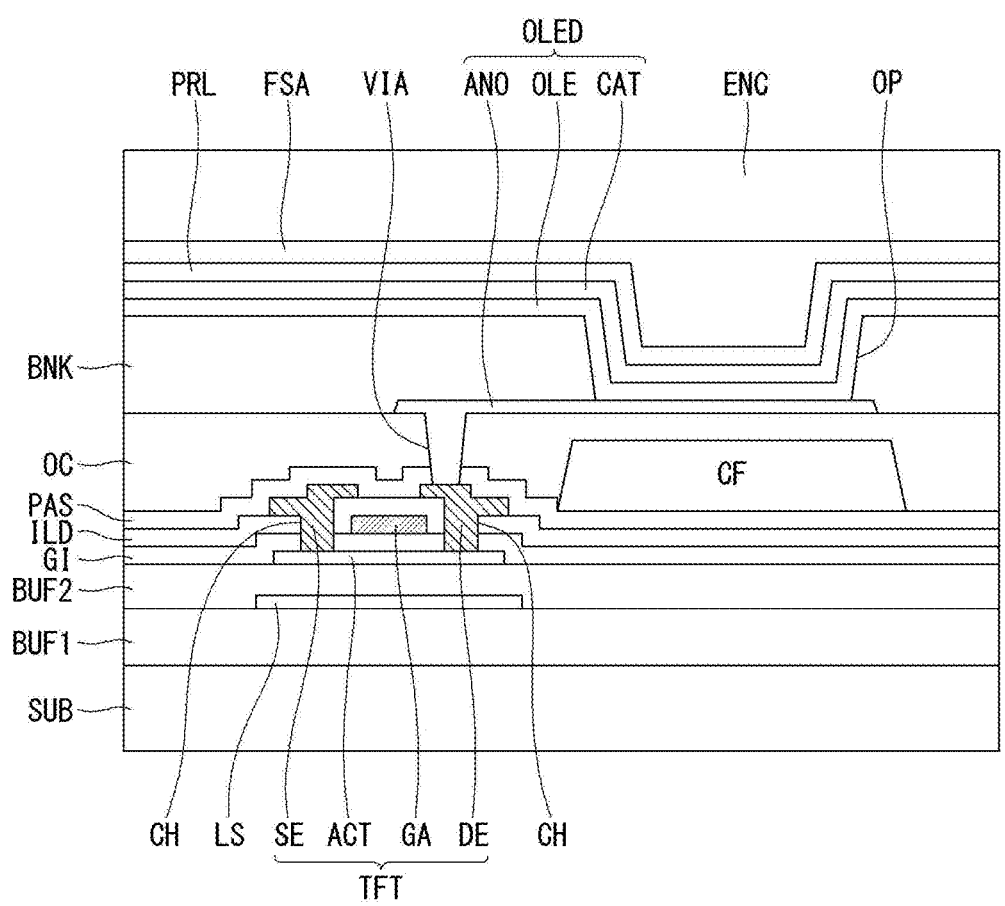
FIG. 6 is a cross-sectional view illustrating a portion of a subpixel of an OLED display according to an embodiment of the disclosure.
Figure 7:
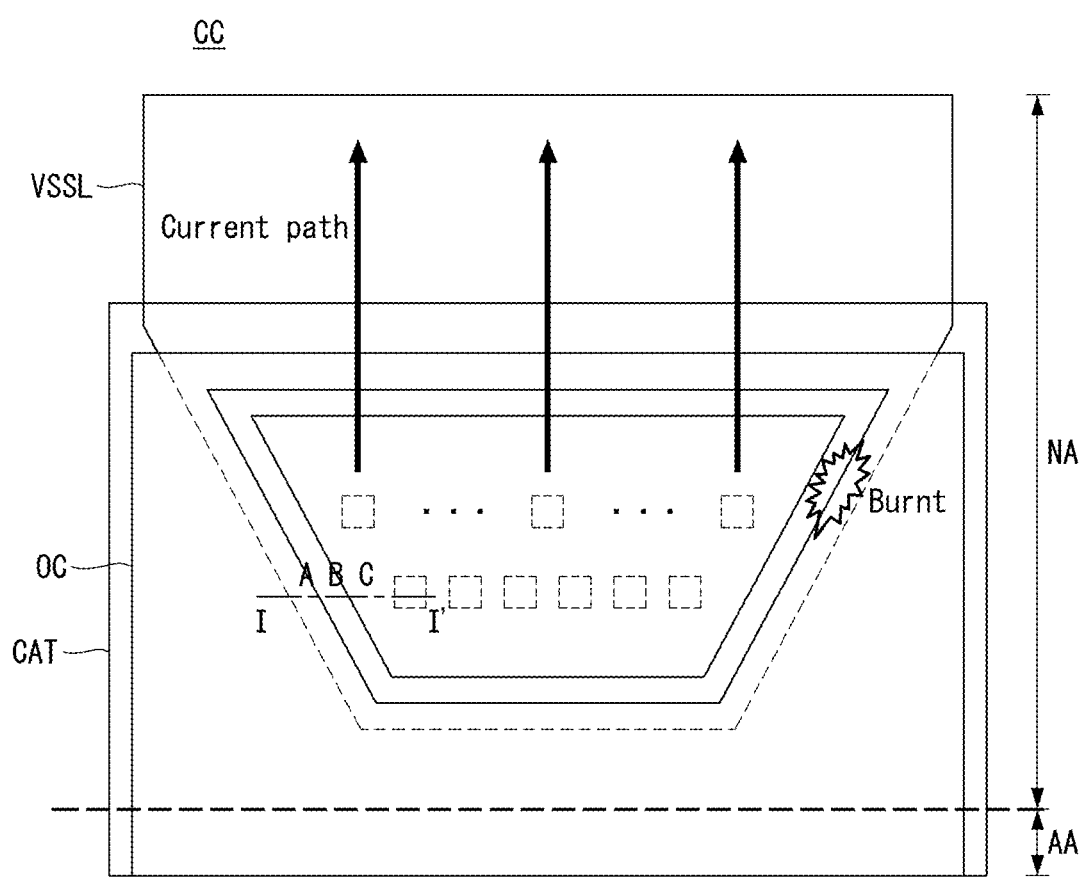
FIG. 7 is an enlarged view of an electrode contact portion shown in FIG. 5.
Figure 8:
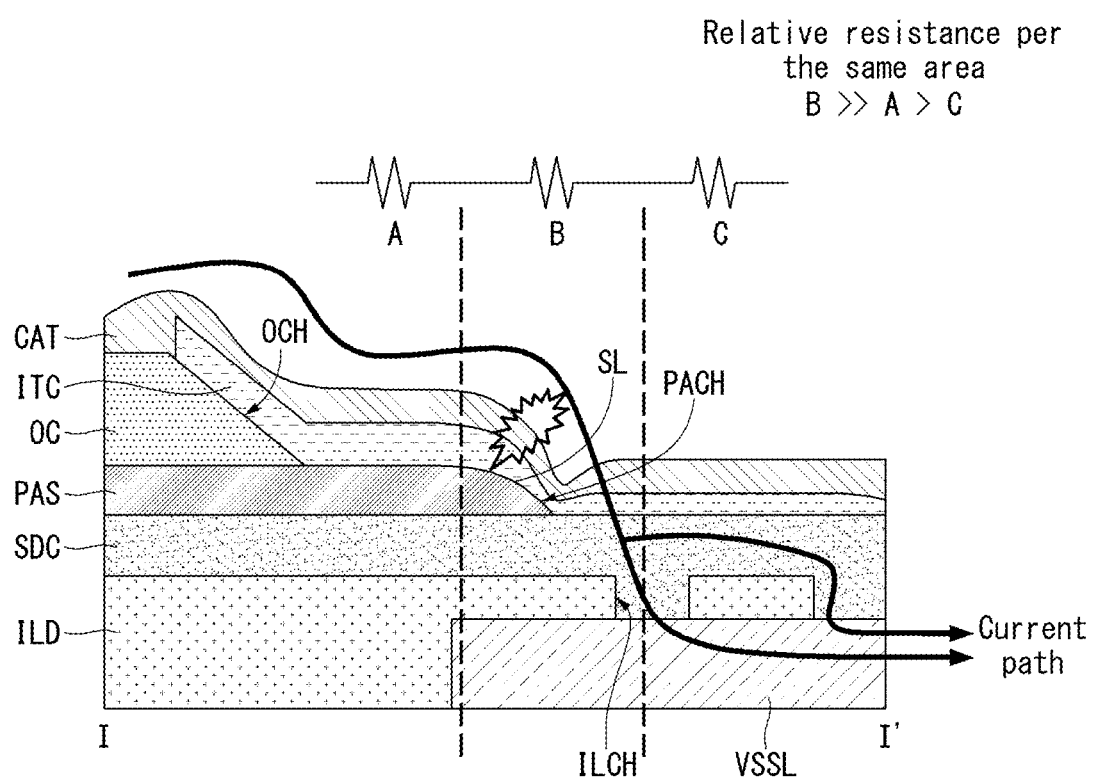
FIG. 8 is a cross-sectional view taken along line I-I' of FIG. 7.
Figure 9:
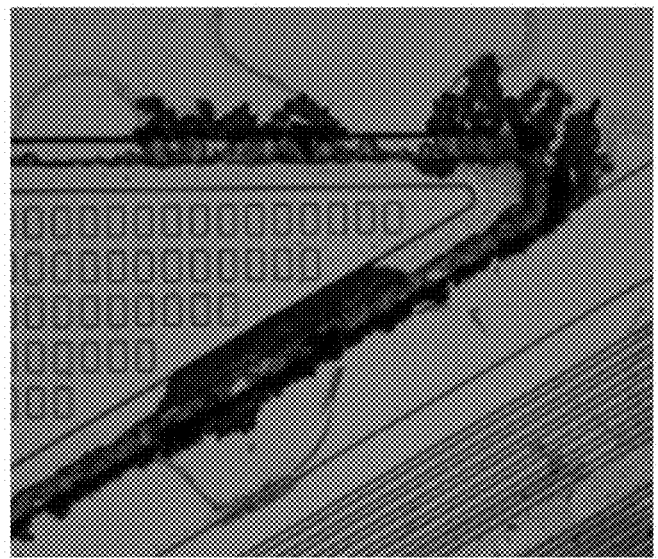
FIG. 9 illustrates an image of an electrode contact portion in which a burnt is generated.

FIG. 5 is a plan view of an OLED display according to an embodiment of the disclosure. FIG. 6 is a cross-sectional view illustrating a portion of a subpixel of an OLED display according to an embodiment of the disclosure. FIG. 7 is an enlarged view of an electrode contact portion shown in FIG. 5. FIG. 8 is a cross-sectional view taken along line I-I' of FIG. 7. FIG. 9 illustrates an image of an electrode contact portion in which a burnt is generated.

Referring to FIG. 5, an OLED display according to an embodiment of the disclosure includes a display area AA and a non-display area NA on a substrate SUB. The non-display area NA includes GIP drivers GIP respectively disposed on left and right sides of the substrate SUB and a pad unit PD disposed on a lower side of the substrate SUB. The display area AA includes a plurality of subpixels SP. For example, R (red), G (green), and B (blue) subpixels or R, G, B, and W (white) subpixels of the display area AA may emit light to represent a full color. The GIP drivers GIP apply a gate driving signal to the display area AA. Chip-on films COF are attached to the pad unit PD disposed on one side, for example, the lower side of the display area AA. A data signal and electric power are applied to a plurality of signal lines (not shown) connected to the display area AA through the chip-on films COF.

A partial cross-sectional structure of a subpixel SP of the OLED display according to the embodiment of the disclosure is described below with reference to FIG. 6.

As shown in FIG. 6, in the OLED display according to the embodiment of the disclosure, a first buffer layer BUF1 is positioned on the substrate SUB. The substrate SUB may be a flexible substrate or a glass substrate, and the flexible substrate may be a flexible resin substrate formed of, for example, polyimide. The first buffer layer BUF1 protects a thin film transistor formed in a subsequent process from impurities, for example, alkali ions discharged from the substrate SUB. The first buffer layer BUF1 may be formed of a silicon oxide (SiOx) layer, a silicon nitride (SiNx) layer, or a multilayer thereof.

A light shielding layer LS is positioned on the first buffer layer BUF1. The light shielding layer LS blocks external light from being incident and thus can prevent a light current from being generated in a thin film transistor. A second buffer BUF2 is positioned on the light shielding layer LS. The second buffer BUF2 protects a thin film transistor formed in a subsequent process from impurities, for example, alkali ions discharged from the light shielding layer LS. The second buffer layer BUF2 may be formed of a silicon oxide (SiOx) layer, a silicon nitride (SiNx) layer, or a multilayer thereof.

A semiconductor layer ACT is positioned on the second buffer layer BUF2 and may be formed of a silicon semiconductor or an oxide semiconductor. The silicon semiconductor may include amorphous silicon or crystallized poly silicon. The poly silicon has high mobility (for example, more than 100 $cm^2/Vs$), low power consumption, and excellent reliability. Thus, the poly silicon can be applied to a gate driver and/or a multiplexer (MUX) for use in a driving element or applied for a driving TFT of each pixel of the OLED display. Because the oxide semiconductor has a low OFF-current, the oxide semiconductor is suitable for a switching TFT which has a short ON-time and a long OFF-time. Further, because the oxide semiconductor increases a voltage hold time of the pixel due to the low OFF-current, the oxide semiconductor is suitable for a display device requiring a low-speed drive and/or low power consumption. In addition, the semiconductor layer ACT includes a drain region and a source region each including p-type or n-type impurities, and also includes a channel region between the drain region and the source region.

A gate insulating layer GI is positioned on the semiconductor layer ACT and may be formed of a silicon oxide (SiOx) layer, a silicon nitride (SiNx) layer, or a multilayer thereof. A gate electrode GA is positioned on the gate insulating layer GI at a location corresponding to a predetermined region (i.e., the channel region when impurities are injected) of the semiconductor layer ACT. The gate electrode GA may be formed of one of molybdenum (Mo), aluminum (Al), chrome (Cr), gold (Au), titanium (Ti), nickel (Ni), neodymium (Nd), and copper (Cu), or a combination thereof. Further, the gate electrode GA may be a multilayer formed of one of molybdenum (Mo), aluminum (Al), chrome (Cr), gold (Au), titanium (Ti), nickel (Ni), neodymium (Nd), and copper (Cu), or a combination thereof. For example, the gate electrode GA may be formed as a double layer of Mo/Al—Nd or Mo/Al.

An interlayer dielectric layer ILD is positioned on the gate electrode GA and insulates the gate electrode GA. The interlayer dielectric layer ILD may be formed of a silicon oxide (SiOx) layer, a silicon nitride (SiNx) layer, or a multilayer thereof. Contact holes CH exposing a portion of the semiconductor layer ACT are formed at a portion where each of the interlayer dielectric layer ILD and the gate insulating layer GI is formed.

A drain electrode DE and a source electrode SE are positioned on the interlayer dielectric layer ILD. The drain electrode DE is connected to the semiconductor layer ACT through the contact hole CH exposing the drain region of the semiconductor layer ACT, and the source electrode SE is connected to the semiconductor layer ACT through the contact hole CH exposing the source region of the semiconductor layer ACT. Each of the source electrode SE and the drain electrode DE may be formed as a single layer or as a multilayer. When each of the source electrode SE and the drain electrode DE is formed as the single layer, each of the source electrode SE and the drain electrode DE may be formed of one of molybdenum (Mo), aluminum (Al), chrome (Cr), gold (Au), titanium (Ti), nickel (Ni), neodymium (Nd), and copper (Cu), or a combination thereof. When each of the source electrode SE and the drain electrode DE is formed as the multilayer, each of the source electrode SE and the drain electrode DE may be formed as a double layer of Mo/Al—Nd or as a triple layer of Ti/Al/Ti, Mo/Al/Mo or Mo/Al-Nd/Mo. Thus, a thin film transistor TFT including the semiconductor layer ACT, the gate electrode GA, the source electrode SE, and the drain electrode DE is formed.

Further, a passivation layer PAS is positioned on the substrate SUB including the thin film transistor TFT. The passivation layer PAS is an insulating layer protecting the component underlying the passivation layer PAS and may be formed of a silicon oxide (SiOx) layer, a silicon nitride (SiNx) layer, or a multilayer thereof. A color filter CF is positioned on the passivation layer PAS. The color filter CF serves to convert white light emitted by an organic light emitting diode OLED into red, green, or blue light. An overcoat layer OC is positioned on the color filter CF. The overcoat layer OC may be a planarization layer for reducing a height difference (or step coverage) of an underlying structure and may be formed of an organic material such as polyimide, benzocyclobutene-based resin, and acrylate. For example, the overcoat layer OC may be formed through a spin-on glass (SOG) method for coating the organic material in a liquid state and then curing the organic material.

A via hole VIA exposing the drain electrode DE of the thin film transistor TFT is positioned in a portion of the overcoat layer OC. The organic light emitting diode OLED is positioned on the overcoat layer OC. More specifically, a first electrode ANO is positioned on the overcoat layer OC. The first electrode ANO serves as a pixel electrode and is connected to the drain electrode DE of the thin film transistor TFT through the via hole VIA. The first electrode ANO is an anode and may be formed of a transparent conductive material such as indium tin oxide (ITO), indium zinc oxide (IZO), and zinc oxide (ZnO). When the first electrode ANO is a reflective electrode, the first electrode ANO may further include a reflective layer. The reflective layer may be formed of aluminum (Al), copper (Cu), silver (Ag), nickel (Ni), palladium (Pd) or a combination thereof. For example, the reflective layer may be formed of an Ag/Pd/Cu (APC) alloy.

In addition, a bank layer BNK defining pixels is positioned on the substrate SUB including the first electrode ANO. The bank layer BNK may be formed of an organic material such as polyimide, benzocyclobutene-based resin, and acrylate. The bank layer BNK includes a pixel definition portion OP exposing the first electrode ANO. An organic layer OLE contacting the first electrode ANO is positioned at a front surface of the substrate SUB. The organic layer OLE is a layer, in which electrons and holes combine and emit light. A hole injection layer and/or a hole transport layer may be positioned between the organic layer OLE and the first electrode ANO, and an electron injection layer and/or an electron transport layer may be positioned on the organic layer OLE.

A second electrode CAT is positioned on the organic layer OLE and may be positioned on a front surface of the display area AA. In addition, the second electrode CAT is a cathode electrode and may be formed of magnesium (Mg), calcium (Ca), aluminum (Al), silver (Ag), or a combination thereof each having a low work function. When the second electrode CAT is a transmissive electrode, the second electrode CAT may be thin enough to transmit light. Further, when the second electrode CAT is a reflective electrode, the second electrode CAT may be thick enough to reflect light. A protective layer PRL is positioned on the second electrode CAT. A protective member ENC is attached to an upper surface of the substrate SUB, on which the thin film transistor TFT and the organic light emitting diode OLED are formed, through an adhesive layer FSA. The protective member ENC may be a metal thin film.

Referring again to FIG. 5, the non-display area NA of the OLED display thus configured includes a low potential voltage line supplying a low potential voltage to the second electrode CAT and an electrode contact portion CC connected to the second electrode CAT. This is described in detail below.

Referring to FIG. 7, the electrode contact portion CC is positioned in the non-display area NA of the OLED display. In the electrode contact portion CC, a low potential voltage line VSSL extended from the pad unit (not shown) and the second electrode CAT extended from the display area AA overlap and are connected to each other. A current path from the second electrode CAT to the low potential voltage line VSSL is formed.

More specifically, referring to FIG. 8, the low potential voltage line VSSL contacts a first connection pattern SDC positioned on the low potential voltage line VSSL through an interlayer hole ILCH of the interlayer dielectric layer ILD. The first connection pattern SDC may be formed of a material of the source and drain electrodes. The first connection pattern SDC contacts a second connection pattern ITC positioned on the first connection pattern SDC through a passivation hole PACH of the passivation layer PAS and an overcoat hole OCH of the overcoat layer OC. The second connection pattern ITC may be formed of the same material as the first electrode ANO, for example, metal oxide such as ITO. The second electrode CAT on the second connection pattern ITC directly contacts the second connection pattern ITC and finally is electrically connected to the low potential voltage line VSSL.

The electrode contact portion CC may include a first area A, a second area B, and a third area C. The first area A is an area in which the overcoat hole OCH is positioned. The second area B is an area from which the passivation hole PACH starts, and an inclined portion SL of the passivation hole PACH is positioned in the second area B. The third area C is an area, in which the passivation layer PAS is not present, and corresponds to an inner area of the passivation hole PACH.

A current path in the first to third areas A, B, and C is configured such that a current flows from the second electrode CAT of the first area A to the low potential voltage line VSSL of the third area C via the second area B. In this instance, a thickness of the second electrode CAT decreases in the inclined portion SL of the passivation hole PACH. More specifically, when the passivation hole PACH is formed through a dry etching due to the properties of an inorganic material of the passivation layer PAS, an inclined angle of the inclined portion SL greatly increases. On the other hand, because the overcoat hole OCH is formed through a wet etching due to the properties of an organic material of the overcoat layer OC, an inclined angle of the overcoat hole OCH decreases. Thus, because the thickness of the second electrode CAT decreases in the second area B in which the inclined portion SL of the passivation hole PACH is disposed, a resistance of the second electrode CAT of the second area B increases. A resistance per the same area in the first to third areas A, B, and C has a maximum value in the second area B and decreases in order of the first area A and the third area C. As shown in FIG. 9, heat generation increases depending on the resistance in the second area B in which the inclined portion SL of the passivation hole PACH is disposed, and thus a burnt is generated.

Hereinafter, embodiments capable of solving a problem of the burnt in the electrode contact portion by changing a structure of the electrode contact portion are described.

Embodiment

Figure 10:
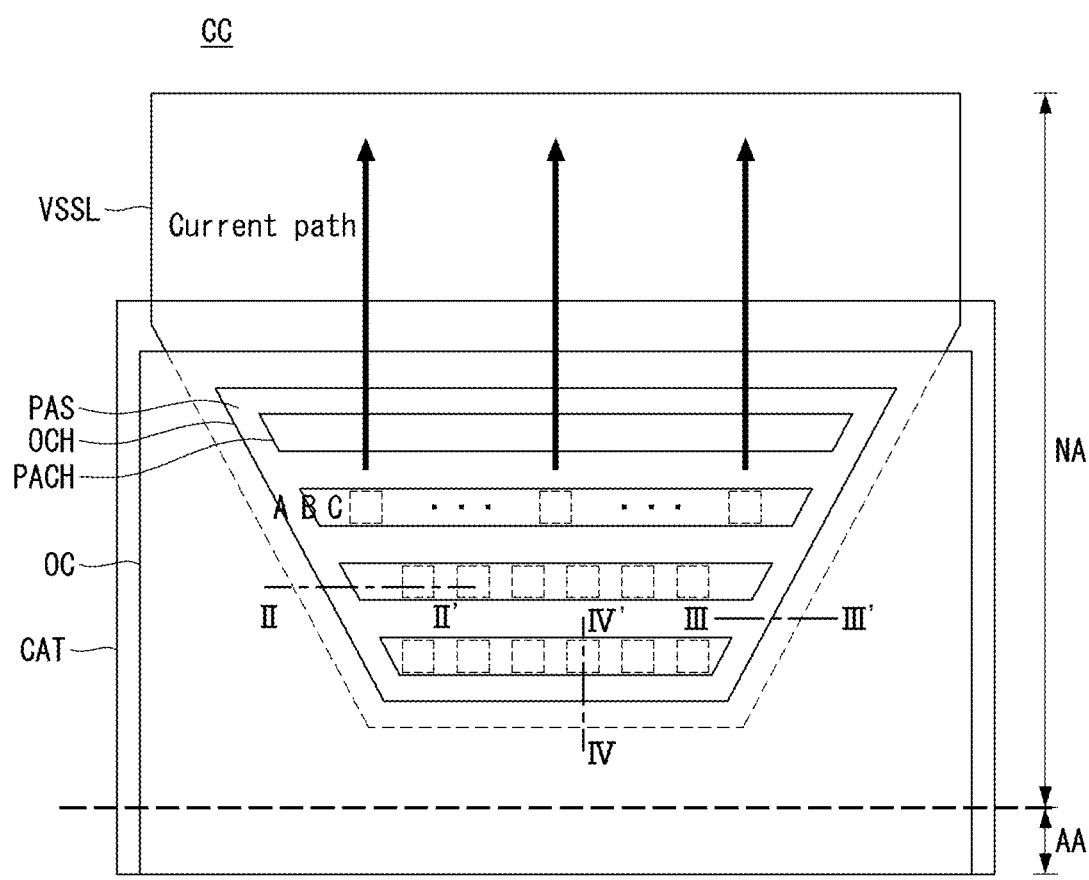
FIG. 10 is a plan view of an electrode contact portion according to an embodiment of the disclosure.
Figure 11:
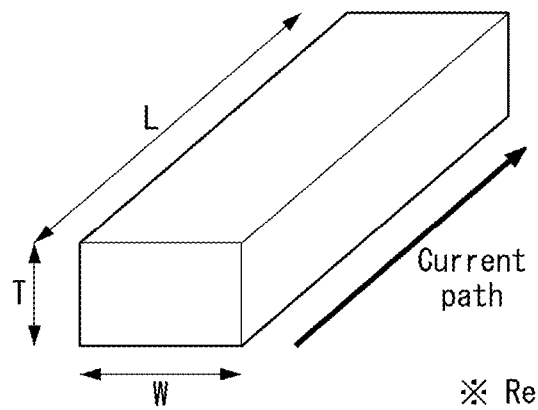
FIG. 11 schematically illustrates a relationship between a signal line and a resistance.
Figure 12:
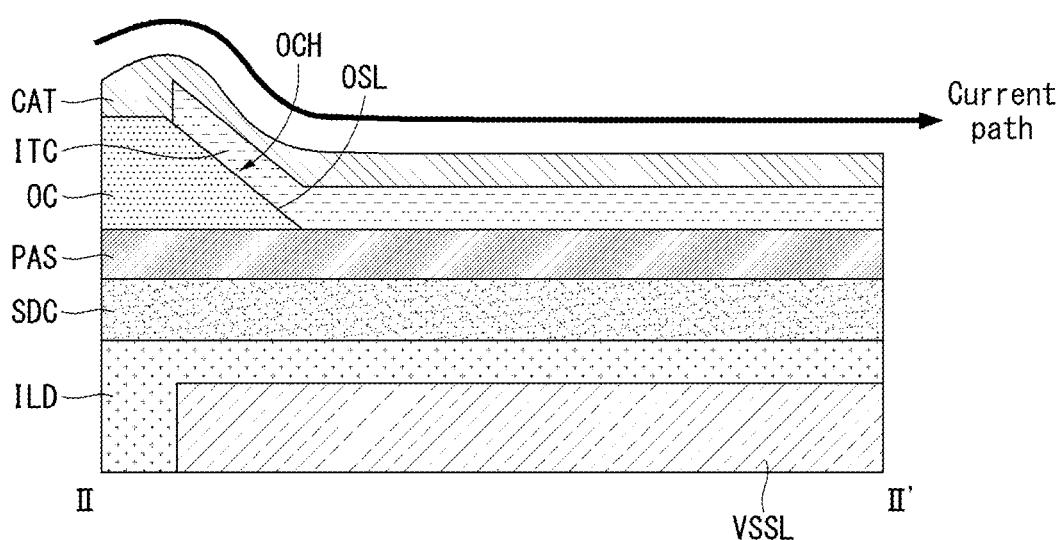
FIG. 12 is a cross-sectional view taken along line II-II' of FIG. 10.
Figure 13:
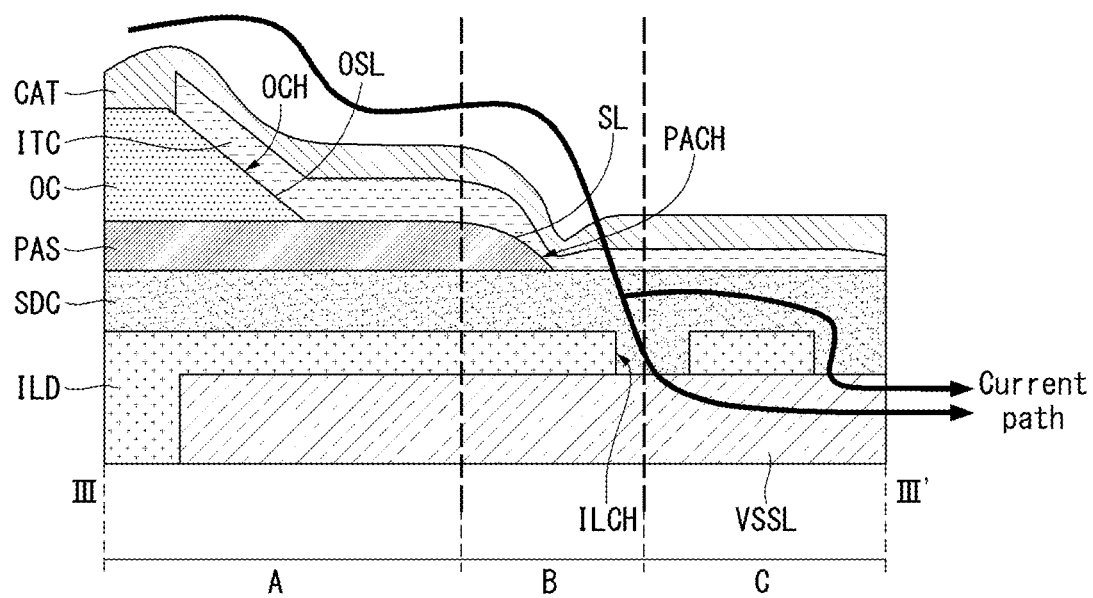
FIG. 13 is a cross-sectional view taken along line III-III' of FIG. 10.
Figure 14:
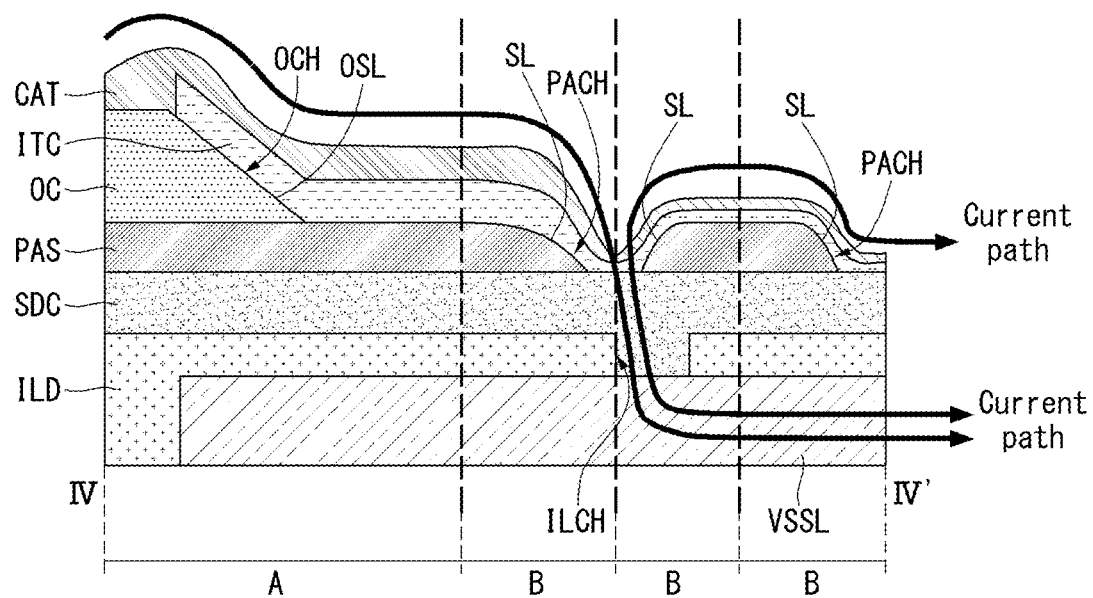
FIG. 14 is a cross-sectional view taken along line IV-IV' of FIG. 10.
Figure 15:
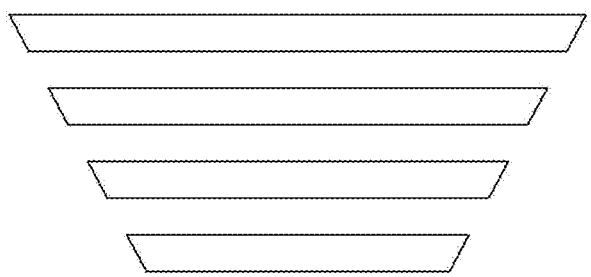
FIGS. 15 to 17 illustrate various planar shapes of a passivation hole.
Figure 16:
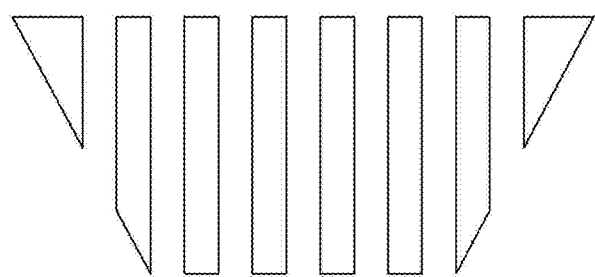
Figure 17:
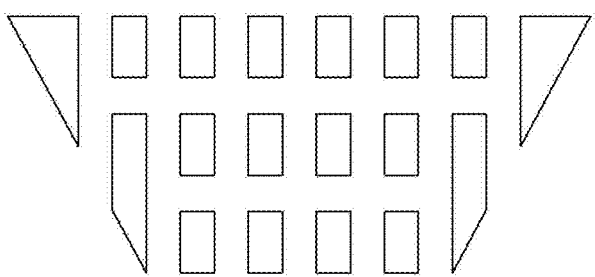

FIG. 10 is a plan view of an electrode contact portion according to an embodiment of the disclosure. FIG. 11 schematically illustrates a relationship between a signal line and a resistance. FIG. 12 is a cross-sectional view taken along line II-II' of FIG. 10. FIG. 13 is a cross-sectional view taken along line III-III' of FIG. 10. FIG. 14 is a cross-sectional view taken along line IV-IV' of FIG. 10. FIGS. 15 to 17 illustrate various planar shapes of a passivation hole.

Referring to FIG. 10, an OLED display according to an embodiment of the disclosure includes an electrode contact portion CC in a non-display area NA. In the electrode contact portion CC, a low potential voltage line VSSL extended from a pad unit (not shown) and a second electrode CAT extended from a display area AA overlap and are connected to each other.

The low potential voltage line VSSL is disposed on a substrate (not shown), and a passivation layer PAS and an overcoat layer OC are disposed on the low potential voltage line VSSL. The second electrode CAT is disposed on the overcoat layer OC. The overcoat layer OC includes an overcoat hole OCH exposing the passivation layer PAS, and the passivation layer PAS includes a plurality of passivation holes PACH so that the second electrode CAT contacts the low potential voltage line VSSL. Thus, the second electrode CAT is connected to the low potential voltage line VSSL through the overcoat hole OCH of the overcoat layer OC and the passivation holes PACH of the passivation layer PAS. A current path between the low potential voltage line VSSL and the second electrode CAT proceeds from the second electrode CAT to the low potential voltage line VSSL The embodiment of the disclosure includes the plurality of passivation holes PACH for connecting the low potential voltage line VSSL and the second electrode CAT, unlike FIG. 7. The plurality of passivation holes PACH is disposed inside the overcoat hole OCH when viewed from the plane. In embodiments disclosed herein, an entire perimeter of the plurality of passivation holes PACH is longer than a perimeter of the overcoat hole OCH.

Referring to FIG. 11, there is a signal line having a predetermined thickness T, a predetermined width W, and a predetermined length L. A resistance of the signal line may decrease by increasing the width W under the condition of the same thickness.

Using a principle illustrated in FIG. 11, the embodiment of the disclosure can reduce a resistance of the second electrode CAT by increasing an area (i.e., an area of an inclined portion SL of the passivation hole PACH), in which the resistance of the second electrode CAT increases due to a reduction in a thickness of the second electrode CAT. In this instance, the area of the inclined portion SL of the passivation hole PACH is proportional to a length of a perimeter of the passivation hole PACH. Thus, the embodiment of the disclosure can reduce the resistance of the second electrode CAT by increasing the length of the perimeter of the passivation hole PACH as in FIG. 11 in which the width W of the signal line increases.

With reference to FIGS. 12 to 14, a cross sectional structure of each of the areas A, B, and C shown in FIG. 10 is described in detail. More specifically, FIG. 12 illustrates a cross sectional structure of an area in which the passivation hole PACH is not formed in the electrode contact portion CC.

Referring to FIG. 12, a low potential voltage line VSSL is disposed on a substrate (not shown). The low potential voltage line VSSL may be formed of a material of a gate electrode of a thin film transistor. An interlayer dielectric layer ILD is positioned on the low potential voltage line VSSL. A first connection pattern SDC is positioned on the interlayer dielectric layer ILD. The first connection pattern SDC may be made of a material of source and drain electrodes of the thin film transistor and may be formed in an island pattern in the electrode contact portion CC. A passivation layer PAS is disposed on the first connection pattern SDC, and the overcoat layer OC is disposed on the passivation layer PAS. An overcoat layer OC includes the overcoat hole OCH for exposing the passivation layer PAS underlying the overcoat layer OC. A second connection pattern ITC is disposed on the overcoat layer OC and the passivation layer PAS, and a second electrode CAT is disposed on the overcoat layer OC and the second connection pattern ITC.

Because the passivation hole PACH is not formed in the area shown in FIG. 12, the second electrode CAT is not connected to the low potential voltage line VSSL. Thus, a current path of the second electrode CAT flows along the second electrode CAT.

Referring to FIG. 13 which illustrates a cross sectional structure of an area in which a passivation hole PACH is formed in an electrode contact portion CC, a low potential voltage line VSSL is disposed on a substrate (not shown). The low potential voltage line VSSL may be formed of a material of a gate electrode of a thin film transistor. An interlayer dielectric layer ILD is positioned on the low potential voltage line VSSL and includes at least one interlayer hole ILCH for exposing the low potential voltage line VSSL underlying the interlayer dielectric layer ILD. A first connection pattern SDC is positioned on the interlayer dielectric layer ILD. The first connection pattern SDC may be made of a material of source and drain electrodes of the thin film transistor and may be formed in an island pattern in the electrode contact portion CC. The first connection pattern SDC contacts the low potential voltage line VSSL through the interlayer hole ILCH.

A passivation layer PAS is disposed on the first connection pattern SDC. The passivation layer PAS includes the passivation hole PACH for exposing the first connection pattern SDC underlying the passivation layer PAS. The passivation hole PACH includes an inclined portion SL which exposes the first connection pattern SDC as a thickness of the passivation layer PAS decreases.

An overcoat layer OC is disposed on the passivation layer PAS. The overcoat layer OC includes an overcoat hole OCH for exposing the passivation layer PAS and the first connection pattern SDC that are positioned below the overcoat layer OC. The overcoat hole OCH includes an inclined portion OSL which exposes the passivation layer PAS and the first connection pattern SDC as a thickness of the overcoat layer OC decreases. A second connection pattern ITC is disposed on the overcoat layer OC, the passivation layer PAS, and the first connection pattern SDC. The second connection pattern ITC is formed along step coverage of the overcoat layer OC and the passivation layer PAS and contacts the first connection pattern SDC. The second connection pattern ITC may be formed of the same material as a first electrode ANO, for example, metal oxide such as ITO.

A second electrode CAT is disposed on the overcoat layer OC and the second connection pattern ITC. The second electrode CAT is formed along step coverage of the second connection pattern ITC. Thus, the second electrode CAT directly contacts the second connection pattern ITC and finally is electrically connected to the low potential voltage line VSSL.

Referring to FIGS. 10 to 13, the electrode contact portion CC may include a first area A, a second area B, and a third area C. The first area A is an area from which the flat overcoat hole OCH starts, and the inclined portion OSL of the overcoat hole OCH is positioned in the first area A. The second area B is an area from which the passivation hole PACH starts, and the inclined portion SL of the passivation hole PACH is positioned in the second area B. The third area C is an area, in which the passivation layer PAS is not present, and corresponds to an inner area of the passivation hole PACH.

A current path in the first to third areas A, B, and C is configured such that a current flows from the second electrode CAT of the first area A to the low potential voltage line VSSL of the third area C via the second area B. In this instance, the inclined portion SL of the passivation hole PACH is an area in which a thickness of the second electrode CAT decreases, and thus acts as a factor for increasing a resistance of the second electrode CAT.

Referring to FIG. 14 which illustrates a cross sectional structure of a plurality of passivation holes PACH, a low potential voltage line VSSL is disposed on a substrate (not shown). An interlayer dielectric layer ILD is positioned on the low potential voltage line VSSL and includes at least one interlayer hole ILCH for exposing the low potential voltage line VSSL underlying the interlayer dielectric layer ILD. A first connection pattern SDC is positioned on the interlayer dielectric layer ILD. The first connection pattern SDC contacts the low potential voltage line VSSL through the interlayer hole ILCH.

A passivation layer PAS is disposed on the first connection pattern SDC. The passivation layer PAS includes the plurality of passivation holes PACH for exposing the first connection pattern SDC underlying the passivation layer PAS. The passivation holes PACH respectively include inclined portions SL which exposes the first connection pattern SDC as a thickness of the passivation layer PAS decreases.

An overcoat layer OC is disposed on the passivation layer PAS. The overcoat layer OC includes an overcoat hole OCH for exposing the passivation layer PAS and the first connection pattern SDC that are positioned below the overcoat layer OC. The overcoat hole OCH includes an inclined portion OSL which exposes the passivation layer PAS and the first connection pattern SDC as a thickness of the overcoat layer OC decreases. A second connection pattern ITC is disposed on the overcoat layer OC, the passivation layer PAS, and the first connection pattern SDC. The second connection pattern ITC is formed along step coverage of the overcoat layer OC and the passivation layer PAS and contacts the first connection pattern SDC. A second electrode CAT is disposed on the overcoat layer OC and the second connection pattern ITC. The second electrode CAT is formed along step coverage of the second connection pattern ITC. Thus, the second electrode CAT directly contacts the second connection pattern ITC and finally is electrically connected to the low potential voltage line VSSL.

An electrode contact portion CC shown in FIG. 14 includes a first area A, in which the inclined portion OSL of the overcoat hole OCH is positioned, and second areas B in which the inclined portions SL of the passivation holes PACH are disposed. A current path in the first and second areas A and B is configured such that a current flows from the second electrode CAT of the first area A to the low potential voltage line VSSL via the second areas B.

The embodiment of the disclosure increases the path of the current flowing from the second electrode CAT to the low potential voltage line VSSL, thereby reducing an entire resistance and a current density of the second electrode CAT. More specifically, the embodiment of the disclosure can reduce the entire resistance and the current density of the second electrode CAT in the electrode contact portion CC by increasing an area of the inclined portion SL of the passivation hole PACH. Because the area of the inclined portion SL of the passivation hole PACH is proportional to a length of a perimeter of the passivation hole PACH, an increase in the length of a perimeter of the passivation hole PACH can exhibit the same effect as an increase in the area of the inclined portion SL of the passivation hole PACH.

The passivation hole PACH may have various shapes, in order to increase the current path from the second electrode CAT to the low potential voltage line VSSL.

For example, as shown in FIGS. 15 and 16, the passivation hole PACH may have a horizontal stripe planar shape or a vertical stripe planar shape. Alternatively, as shown in FIG. 17, the passivation hole PACH may have a dot planar shape. The passivation hole PACH may have any planar shape as long as the area of the inclined portion SL of the passivation hole PACH is greater than an area of the inclined portion OSL of the overcoat hole OCH, or an entire perimeter of the passivation hole PACH is longer than a perimeter of the overcoat hole OCH. In addition, FIGS. 15 to 17 illustrate that the passivation hole PACH has a planar shape of a plurality of triangles or a plurality of rectangles, by way of example. However, a shape of a plurality of circles or a plurality of random shapes may be used.

As described above, the embodiments of the disclosure include the plurality of passivation holes of the passivation layer in the electrode contact portion and cause the entire perimeter of the passivation holes to be longer than the perimeter of the overcoat hole of the overcoat layer. Alternatively, the embodiments of the disclosure cause the area of the inclined portion of the passivation hole to be greater than the area of the inclined portion of the overcoat hole. Hence, the embodiments of the disclosure can increase the current path from the second electrode to the low potential voltage line and can reduce the entire resistance and the current density of the second electrode. As a result, the embodiments of the disclosure can prevent the burnt from being generated in the electrode contact portion due to the resistance of the second electrode.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
a display area on which an organic light emitting diode including a first electrode, an organic layer, and a second electrode is positioned; and
a non-display area positioned outside the display area, the non-display area including an electrode contact portion in which the second electrode and a low potential voltage line are connected to each other through at least one connection pattern,
wherein the electrode contact portion includes:
a passivation layer including a plurality of passivation holes exposing the at least one connection pattern; and
an overcoat layer including an overcoat hole exposing the passivation layer, and
wherein the plurality of passivation holes are formed such that an entire perimeter of the plurality of passivation holes is longer than a perimeter of the overcoat hole, or an area of inclined portions of the plurality of passivation holes is greater than an area of the inclined portion of the overcoat hole.

2. The display device of claim 1, wherein the plurality of passivation holes is disposed inside the overcoat hole.

3. The display device of claim 1, further comprising:
a first connection pattern positioned on the low potential voltage line and contacting the low potential voltage line; and
a second connection pattern positioned on the first connection pattern and contacting the first connection pattern.

4. The display device of claim 3, wherein the second connection pattern contacts the first connection pattern along inclined portions of the plurality of passivation holes.

5. The display device of claim 3, wherein the passivation layer is positioned between the first connection pattern and the second connection pattern,
wherein the plurality of passivation holes exposes the first connection pattern.

6. The display device of claim 5, wherein the second electrode is positioned on the second connection pattern and contacts the second connection pattern.

7. The display device of claim 1, wherein the first electrode is an anode, and the second electrode is a cathode.

8. The display device of claim 1, wherein the plurality of passivation holes has a stripe planar shape or a dot planar shape.

* * * * *